(12) United States Patent
Tokuda et al.

(10) Patent No.: US 9,391,129 B2
(45) Date of Patent: Jul. 12, 2016

(54) DISPLAY DEVICE

(71) Applicant: Japan Display Inc., Tokyo (JP)

(72) Inventors: Naoki Tokuda, Tokyo (JP); Mitsuhide Miyamoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/275,915

(22) Filed: May 13, 2014

(65) Prior Publication Data

US 2014/0332781 A1 Nov. 13, 2014

(30) Foreign Application Priority Data

May 13, 2013 (JP) ................................. 2013-101459

(51) Int. Cl.
*H01L 33/00* (2010.01)
*H01L 29/18* (2006.01)
*H01L 35/24* (2006.01)
*H01L 29/08* (2006.01)
*H01L 51/00* (2006.01)
*H01L 27/32* (2006.01)
*H01L 51/52* (2006.01)

(52) U.S. Cl.
CPC ........ *H01L 27/3265* (2013.01); *H01L 27/3258* (2013.01); *H01L 51/5271* (2013.01); *H01L 51/5265* (2013.01); *H01L 2251/5315* (2013.01)

(58) Field of Classification Search
CPC ............ H01L 27/3265; H01L 51/5012; H01L 51/5265; H01L 51/5271

USPC ............ 257/40, 98, 88, 72, E51.022; 438/29; 313/504

See application file for complete search history.

(56) References Cited

U.S. PATENT DOCUMENTS

| 5,182,661 | A | * | 1/1993 | Ikeda et al. ...................... 349/38 |
| 2005/0082532 | A1 | * | 4/2005 | Murakami .......... H01L 27/1248 257/72 |
| 2005/0280364 | A1 | | 12/2005 | Omura et al. |
| 2008/0309232 | A1 | * | 12/2008 | Yamamoto .......... H01L 51/5265 313/505 |
| 2009/0091257 | A1 | * | 4/2009 | Yoshinaga ..................... 313/505 |
| 2011/0140114 | A1 | * | 6/2011 | Ko et al. .......................... 257/59 |
| 2012/0261684 | A1 | * | 10/2012 | Koshihara ....................... 257/89 |
| 2014/0284579 | A1 | * | 9/2014 | Tokuda et al. ................... 257/40 |

FOREIGN PATENT DOCUMENTS

| JP | 2002-343555 A | 11/2002 |
| JP | 2006-32327 A | 2/2006 |

* cited by examiner

*Primary Examiner* — Fernando L Toledo
*Assistant Examiner* — Aaron Gray
(74) *Attorney, Agent, or Firm* — Typha IP LLC (57) ABSTRACT

A display device comprising including a plurality of pixels arranged in the shape of a matrix above a substrate, and a plurality of thin film transistors arranged corresponding to each of the plurality of pixel having an organic EL layer, the device comprising; a planarized film covering the thin film transistor and a wire connected with the thin film transistor; a reflecting layer formed above the planarized film; a light path length expanded layer covering the reflecting layer; and a pixel transparent electrode formed above the light path length expanded layer.

13 Claims, 8 Drawing Sheets

DISPLAY DEVICE

CROSS-REFERENCE TO RELATED APPLICATIONS

This application is based upon and claims the benefit of priority from the prior Japanese Patent Application No. 2013-101459, filed on 13 May 2013, the entire contents of which are incorporated herein by reference.

FIELD

The present invention is related to a display device, in particular an organic EL display device with improved visual angle characteristics.

BACKGROUND

In recent years, various organic EL (electroluminescence) display devices are being actively developed (For example, refer to patent document 1 [Japanese Laid Open Patent 2006-32327]), patent document 2 [Japanese Laid Open Patent 2002-343555]).

In an organic EL display device which uses a thin film transistor (TFT), a top emission type organic EL element is widely used for extracting light from the cathode electrode side in order to increase the light emitting area.

In this top emission type organic EL element, micro cavity effects are produced by reflecting and interfering light emitted multiple times by a light emitting layer between an anode electrode (reflecting electrode) and cathode electrode. Due to micro cavity effects the emitted light spectrum width (full width half maximum) becomes steep and luminosity and color intensity increase (for example, refer to patent document 1 [Japanese Laid Open Patent 2006-32327]).

By making the light emitting spectrum width (full width half maximum) steep due to micro cavity effects and improving luminosity when seen from the front, the wavelength changes are large due to changes in the light path length which includes multiple reflected light rays when viewed from a diagonal direction. As a result, color variation increases with changes in the visual angle and visual angle characteristics deteriorate.

Therefore, the present invention aims to reduce micro cavity effects and reduce the visual angle variation in color by increasing the distance between a reflecting portion of the anode electrode side and the cathode side. Alternatively, the present invention aims to provide a display device in which a pixel capacitor can be formed which can store a necessary charge without securing a separate area by increasing the distance between a reflecting portion of an anode electrode and a cathode electrode.

SUMMARY

A display device according to one embodiment of the present invention including a plurality of pixels arranged in the shape of a matrix above a substrate, and a plurality of thin film transistors arranged corresponding to each of the plurality of pixel, the device including a planarized film covering the thin film transistor and a wire connected with the thin film transistor, a reflecting layer formed above the planarized film, a light path length expanded layer covering the reflecting layer, and a pixel transparent electrode formed above the light path length expanded layer, wherein the pixel includes an organic EL layer.

The reflecting layer may be connected to the wire and the pixel transparent electrode.

The reflecting layer may be connected to the wire and forms a capacitance.

The reflecting layer may be a floating electrode.

The reflecting layer and the pixel transparent electrode may be connected and form a capacitance.

The reflecting layer and the pixel transparent electrode may be connected and form a first capacitance, and the reflecting layer and the wire may be connected and form a second capacitance.

The light path length expanded layer may be formed from a resin such as acryl resin, polyimide resin or an Inorganic insulation film such as SiO, SiN.

The display device further includes a upper portion electrode, a distance between the upper portion electrode and the reflecting layer being 500 nm or more.

According to the present invention it is possible to reduce changes in a visual angle of colors by relieving micro cavity effects without adding any changes to an organic EL layer and cathode electrode in a conventional organic EL element and provide a display device in which a pixel capacitor can be formed which can store a charge necessary for stable image display without securing a separate area.

DESCRIPTION OF THE EMBODIMENTS

The embodiments of the display device of the present invention are explained below while referring to the diagrams. Furthermore, the display device of the present invention can be realized by various modifications without limitation to the embodiments described below.

Figure 1:
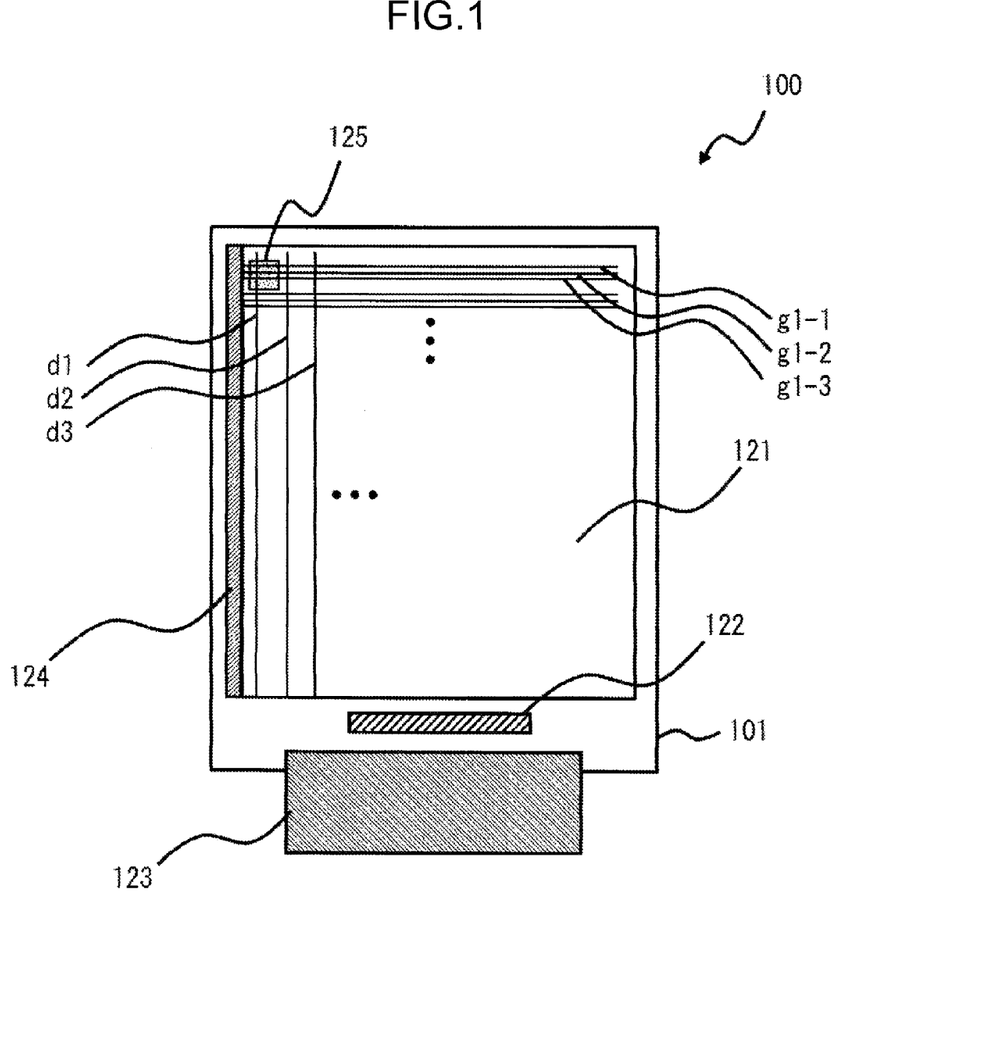
FIG. 1 is a planar view diagram showing an approximate structure of a display device related to one embodiment of the present invention.

An approximate structure of a display device 100 related to one embodiment of the present invention is shown in FIG. 1. The display device 100 related to the present embodiment includes a display area 121, a driver IC 122, a FPC (Flexible Printer Circuit) 123 and a scanning line driver circuit 124 formed above a substrate 101. A plurality of control signal lines g1-1~g1-3 which run in a horizontal direction in the diagram and a plurality of data signal lines d1~d3 which run in a vertical direction are arranged to alternately intersect each other in the display area 121, and a plurality of pixels 125 are arranged in the shape of a matrix at a position corresponding to a portion where the control signal lines g1-1~g1-3 and data signal lines d1~d3 intersect. Although, a structure whereby 3 control signal lines g1-1~g1-3 and 1 data signal line are arranged intersecting each other per single pixel 125 is shown in FIG. 1, the present invention is not limited to this structure. In addition, although not shown in the diagram, a line which supplies a fixed voltage such as a power supply line may also be arranged within the display area 121. By controlling programming of a data voltage supplied to each pixel 125 in response to a control signal supplied from the control signal lines g1-1~g1-3 to each pixel 125, a pixel circuit is arranged including a thin film transistor 102 which controls the light emitting from a pixel 125 and a condenser which stores a data voltage supplied from the data signal lines d1~d3.

Various embodiments with respect to a pixel circuit, a pixel 125 and layers there between in the display device of the present invention are explained below.

Embodiment One

Figure 2:
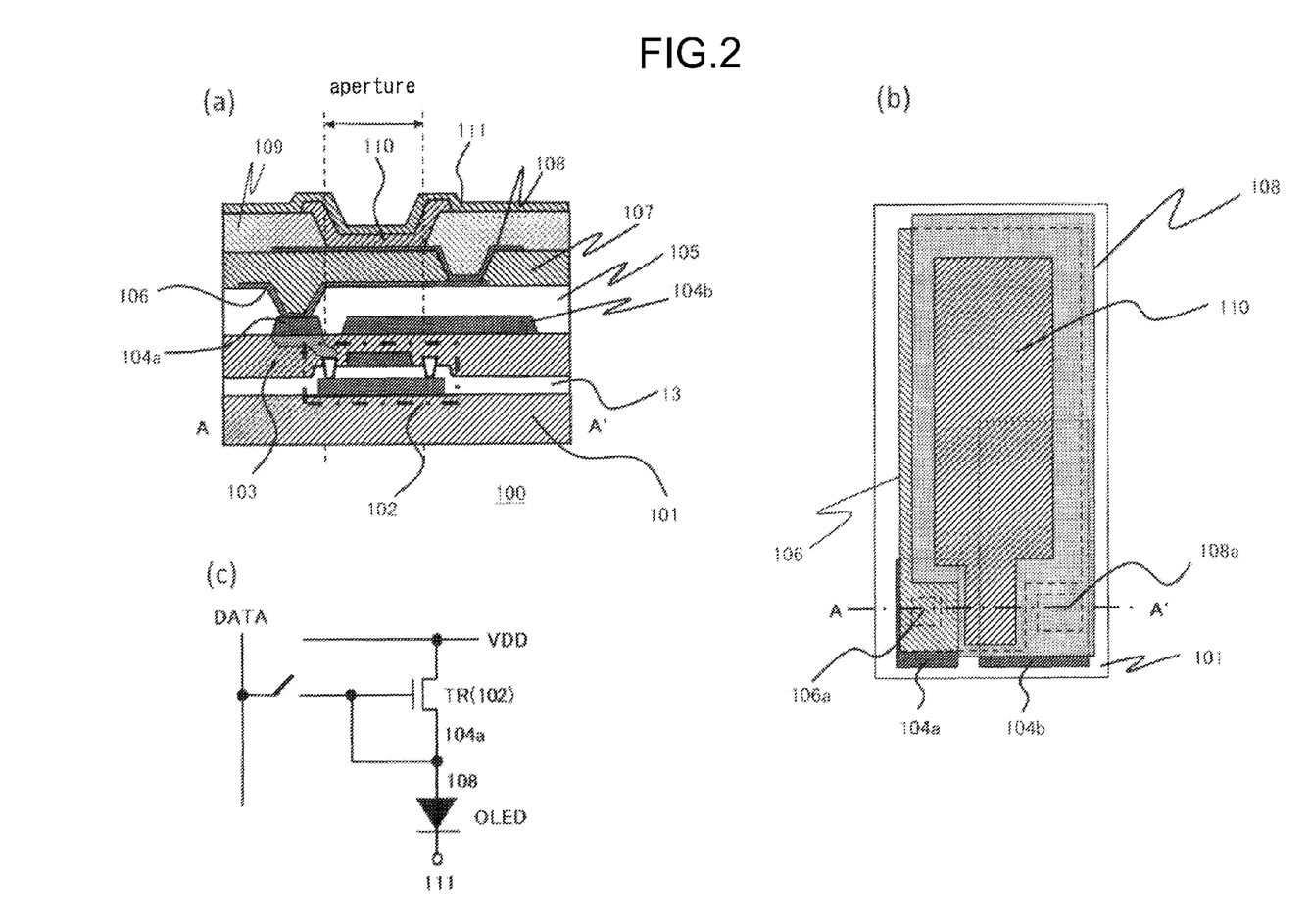
FIG. 2 is a diagram showing an approximate structure of a display device 100 related to one embodiment of the present invention.

FIG. 2 is a diagram shows an approximate structure of a display device 100 related to one embodiment of the present invention. FIG. 2 (b) is a planar view diagram of the display device 100 and FIG. 2 (a) is a cross sectional diagram along the line A-A' in FIG. 2 (b). FIG. 2 (c) is a circuit diagram of the display device 100.

The display device 100 is arranged with a thin film transistor 102 (inside the dotted line in the diagram), an interlayer insulation film 103, wires 104a and 104b, a planarized film 105, a reflecting layer 106, a light path length expanded layer 107, a pixel transparent electrode 108, a bank layer 109, an organic EL layer 110 and a cathode electrode 111 above a substrate 101.

The substrate 101 is formed from an insulation material such as glass for example but may also be formed from silicon. A passivation film (not shown in the diagram) which blocks impurities from the substrate 101 is formed above the substrate 101. The passivation film is formed from a silicon oxide film or silicon nitride film using a known technique (sputtering method, PCVD method, vacuum deposition method etc).

Figure 3:
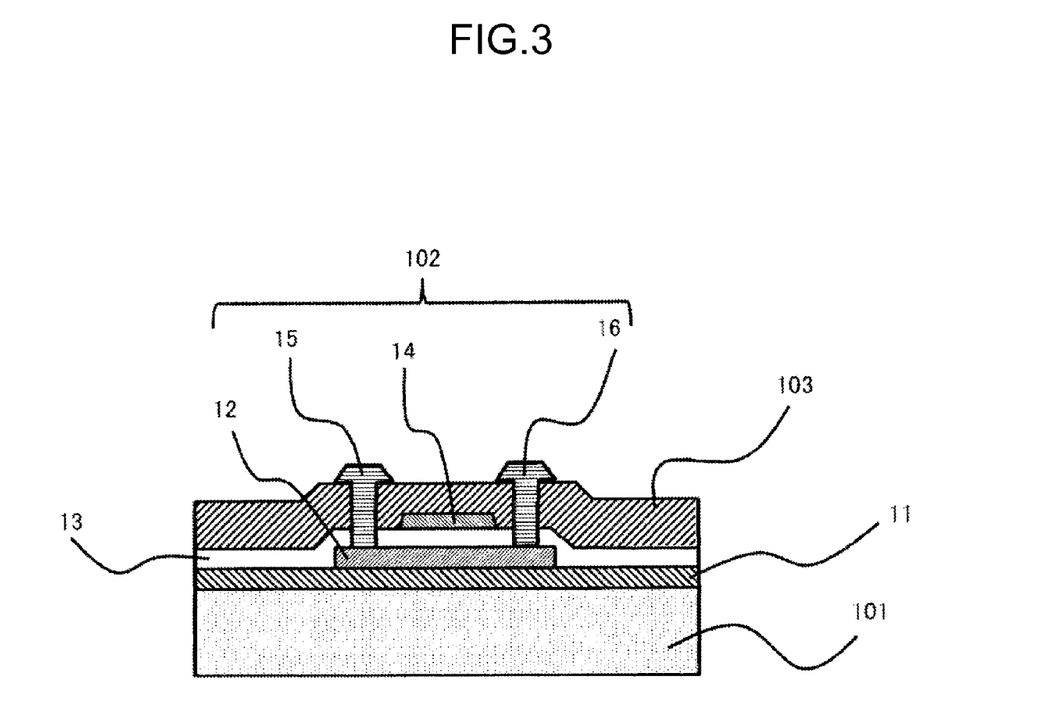
FIG. 3 is a diagram showing an approximate structure of a display device 200 related to another embodiment of the present invention.

A semiconductor layer for forming the thin film transistor 102 is formed above the passivation film. The thin film transistor 102 is shown abbreviated in FIG. 2(a). One example of the structure of the thin film transistor is explained while referring to FIG. 3. The thin film transistor 102 described in FIG. 3 is a top-gate type thin film transistor. A passivation film 11 is formed above the substrate 101. A gate insulation film 13 is formed covering the semiconductor layer 12. A gate electrode 14 is formed above the gate insulation film 13. A contact hole is formed to reach the semiconductor layer 12, and a drain electrode 15 which is connected with a drain region of the semiconductor layer 12, and a source electrode 16 which is connected with a source region of the semiconductor layer are formed. Furthermore, the thin film transistor 102 may have a different structure than that shown in FIG. 3, for example, the thin film transistor 102 may also be a bottom-gate type thin film transistor.

An interlayer insulation film 103 is formed covering the gate electrode of the thin film transistor 102 and wires 104a and 104b are formed above the interlayer insulation film 103. In this specification, the wires 104a and 104b are referred to as a source wire which is connected with the source region of the semiconductor layer 12 of the thin film transistor 102, and a drain wire which is connected with the drain region of the semiconductor layer 12. In FIG. 2, the wire 104a is connected with a drain region via the drain electrode 15.

Furthermore, although not shown in the diagram, a passivation film for protecting the entire thin film transistor 102 may be formed covering the wires 104a, 104b.

The planarized film 105 is formed covering all of the wires 104a, 104b and the thin film transistor 102. The planarized film 105 is formed from acryl resin or polyimide resin to a thickness of several hundreds of nm to several μm.

The reflecting film 106 is formed above the planarized film 105. The reflecting film 106 reflects light and may be formed from gold or Ag, Al or an alloy of these. The reflecting film 106 is connected with the wire 104a via the contact hole 106a.

The light path length expanded film 107 is formed covering the reflecting film 106. The material of the light path length expanded film 107 may be acryl resin or polyimide resin the same as the planarized film 105 or a non-organic insulation film such as SiO or SiN. By adjusting the thickness of the light path length expanded film 107, it is possible to adjust the distance between the reflecting layer 106 and each structure above the reflecting layer 106. In this way, as described below, it is possible to adjust the distance between the reflecting layer 106 and the cathode electrode 111 and relieve micro cavity effects.

The pixel transparent electrode 108 is formed above the light path length expanded film 107. The pixel transparent electrode 108 is formed from an inorganic transparent oxide such as ITO and is transparent. The pixel transparent electrode 108 is connected with the reflecting film 106 via the contact hole 108a. The bank layer 109 is formed at a position which separates the pixel electrode transparent electrode 108 of adjacent pixels.

The organic EL layer 110 and the cathode electrode 111 as an upper part electrode are formed above the pixel transparent electrode 108. In the present embodiment, an organic EL element of the pixel 125 is formed including the pixel transparent electrode 108, organic EL layer 110 and cathode electrode 111. The pixel transparent electrode 108 is an anode electrode in an organic EL element. An inorganic transparent oxide of Ag or ITO sufficiently thin to allow light to pass through is used in the cathode electrode 111 and the cathode electrode 111 allows light to pass through.

A current path for an organic EL element in the present embodiment flows to the pixel transparent electrode 108 from the thin film transistor 102 via the wire 104a and reflecting layer 106 as shown in FIG. 2 (c). That is, a current is supplied from the thin film transistor 102 to the pixel transparent electrode 108 via the wire 104a and reflecting layer 106 in response to a data signal and by supplying the current to the organic EL layer 110, the organic layer 110 emits light and an image is formed.

An organic EL element in the present embodiment has a top-cathode structure comprised of an anode formed by the pixel transparent electrode 108 which is formed on the lower portion of the organic EL layer 110 and a cathode formed by the cathode electrode 111 which is formed on the upper portion of the organic EL layer 110. In the display device 100, the reflecting layer 106 reflects light from the organic EL layer 110 and the light from the organic EL layer 110 is extracted from the direction of the cathode electrode 111. That is, the display device 100 is a top-emission type organic EL display device. Furthermore, the structure of the organic EL element can be formed using a known technology such as side-by-side RGB sub-pixel and a structure combining a color filter with a white light emitting layer may also be applied.

Light which is emitted towards the lower portion of the organic EL layer 110 passes through the pixel transparent electrode 108 and is reflected to the lower portion by the reflecting layer 106.

The light path length expanded layer 107 is arranged in the display device 100 in the present embodiment, the reflecting layer 110 and the pixel transparent electrode 108 are formed on different layers and an intermediate layer is formed between the reflecting layer 106 and the pixel transparent electrode 108, thereby the distance between the cathode electrode 111 and the reflecting layer 106 can be increased without changing the distance between the pixel transparent electrode 108, organic EL layer 110, cathode electrode 111 and the reflecting layer 106. It is possible to widen a light emitting region by arranging a contact hole 106a formed in the planarized film 105 and the contact hole 108a formed in the light path length expanded layer 107 at the same position seen from a planar view. In the present embodiment, the contact hole 106a formed in the planarized film 105 and the contact hole 108a formed in the light path length expanded layer 107 are arranged at different positions seen from a planar view as in FIG. 2 (b). By misaligning the arrangement of the contact hole 106a and the contact hole 108a, it is possible to easily planarize the upper layer portion of the stacked layers. In addition, manufacture becomes easy because it is unnecessary to align the contact hole 106a and contact hole 108a.

Figure 8:
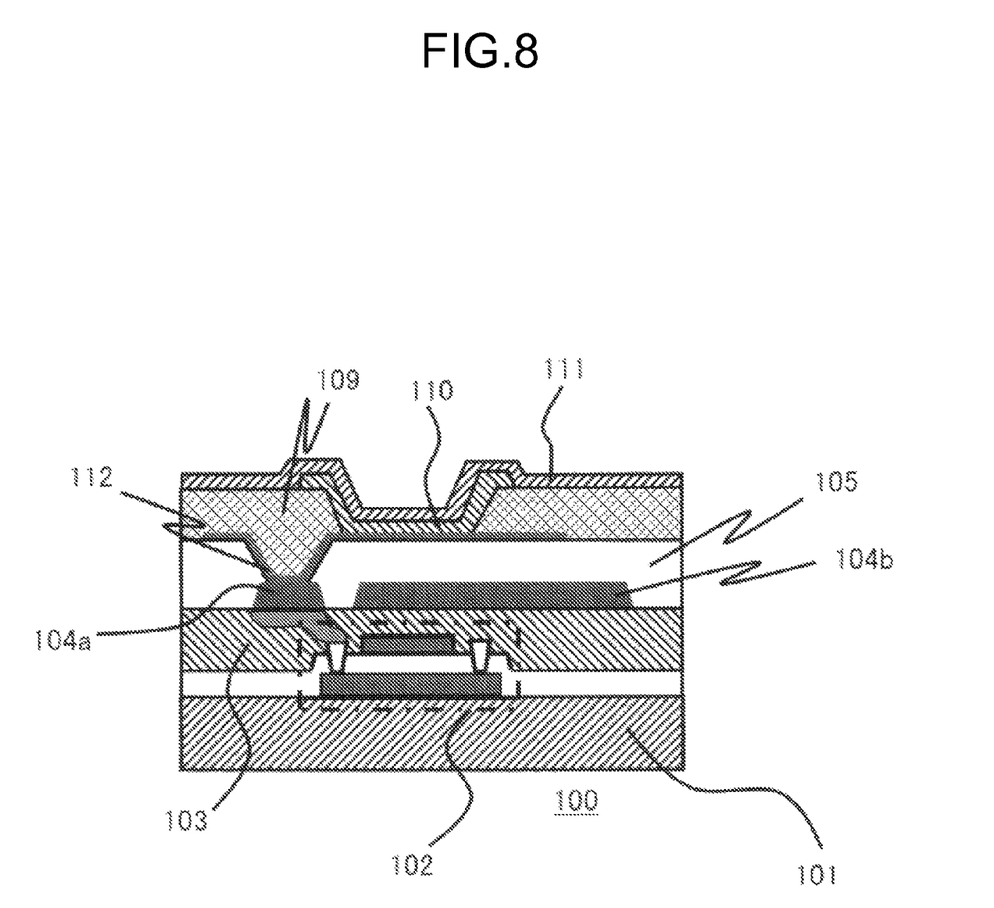
FIG. 8 is a diagram showing an approximate structure of a conventional display device.

In a conventional display device, as is shown in FIG. 8, a structure corresponding to the reflecting layer 106 and pixel transparent electrode 108 forms a single reflecting electrode 112. As a result, there is no room for arranging a structure such as the light path length expanded layer 107 and it is necessary to change the thickness of the organic EL layer in order to change the distance between the reflecting electrode and cathode electrode which makes control of light emitting characteristics difficult.

In the present embodiment, the structure corresponding to the conventional reflecting electrode 112 shown in FIG. 8 is divided into two structures, the reflecting layer 106 and pixel transparent electrode 108. In the present embodiment, by increasing the distance between the cathode electrode 111 and the reflecting layer 106, it is possible to relieve micro cavity effects. Preferably, when the distance between the cathode electrode 111 and the reflecting layer 106 is increased to 500 nm or more, it is possible to relieve micro cavity effects in the visible light region (380 nm~780 nm). In the present embodiment, by arranging the light path length expanded layer 107 and adjusting its thickness, it is possible to increase the distance between the cathode electrode 111 and the reflecting layer 106 to 500 nm or more.

In this way, the display device 100 of the present embodiment which is a top emission type organic EL display device can be provided with excellent control of light emitting characteristics and improved visual angle characteristics without adding any changes to an organic EL layer or cathode electrode.

Embodiment Two

Figure 4:
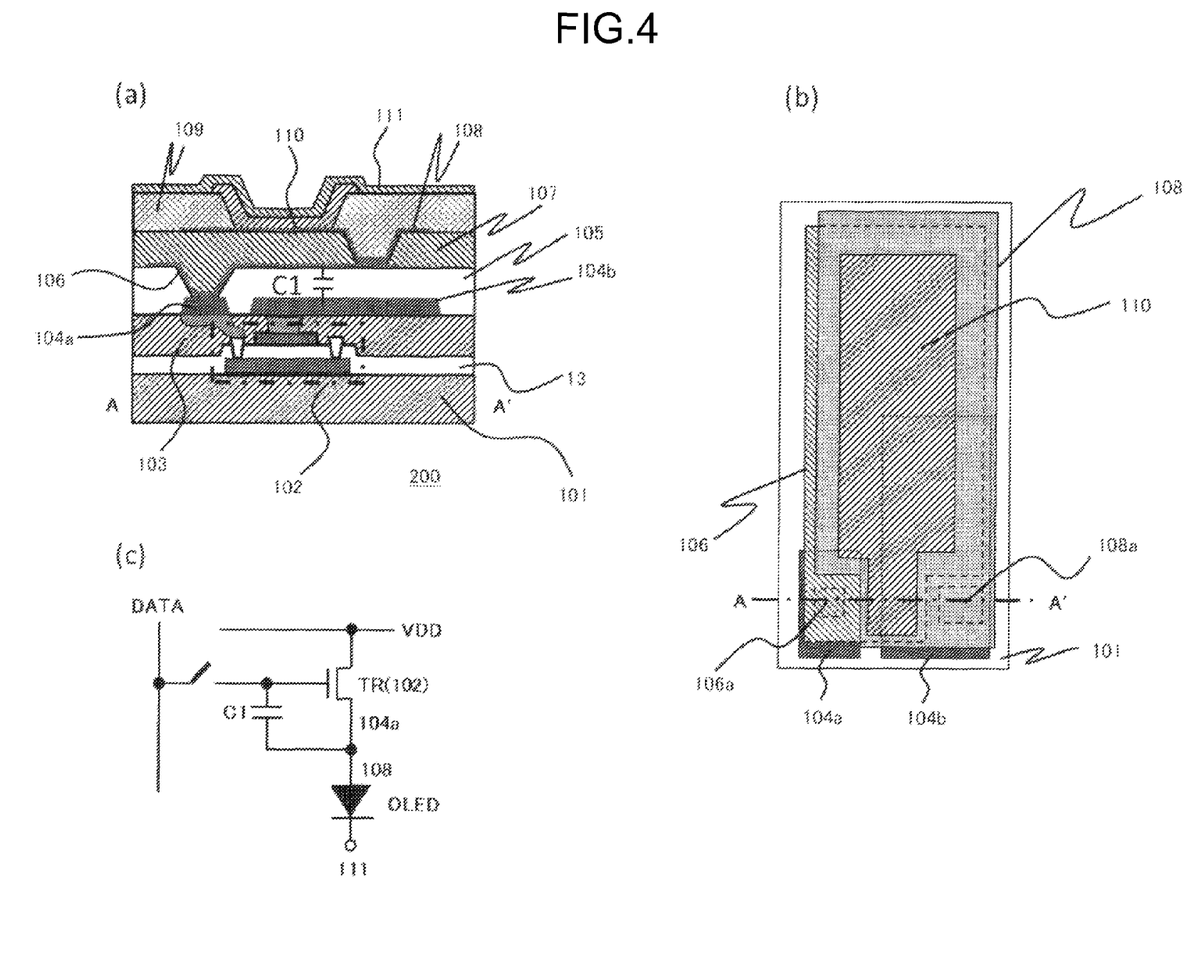
FIG. 4 is a diagram showing an approximate structure of a display device 300 related to another embodiment of the present invention.

Next, the structure of a display device 200 related to another embodiment of the present invention is explained while referring to FIG. 4 (a), FIG. 4 (b) and FIG. 4 (c). FIG. 4 is a diagram showing an approximate structure of the display device related to another embodiment of the present invention. FIG. 4 (a) is a planar view diagram of the display device 200, FIG. 4 (b) is a cross sectional diagram along the line A-A' in FIG. 4 (b). FIG. 4 (c) is a circuit diagram in the display device 200.

Although the display device 200 in FIG. 4 (a) is almost the same structure as the display device 100 explained referring to FIG. 2 (a), the reflecting layer 106 is different by forming a capacitance C1 between the thin film transistor 102 and gate electrode 14. In the present embodiment the capacitance C1 is formed by thinning the planarized film 105.

That is, by applying a voltage to the reflecting layer 1-6 with the same potential as the pixel transparent electrode 108, it is possible to form the capacitance C1 between the reflecting layer 106 and the gate electrode 14 of the thin film transistor 102. In this way it is possible to form a pixel capacitor which can store a charge necessary for a stable pixel display without securing further area for formation a separate capacitor.

Embodiment Three

Figure 5:
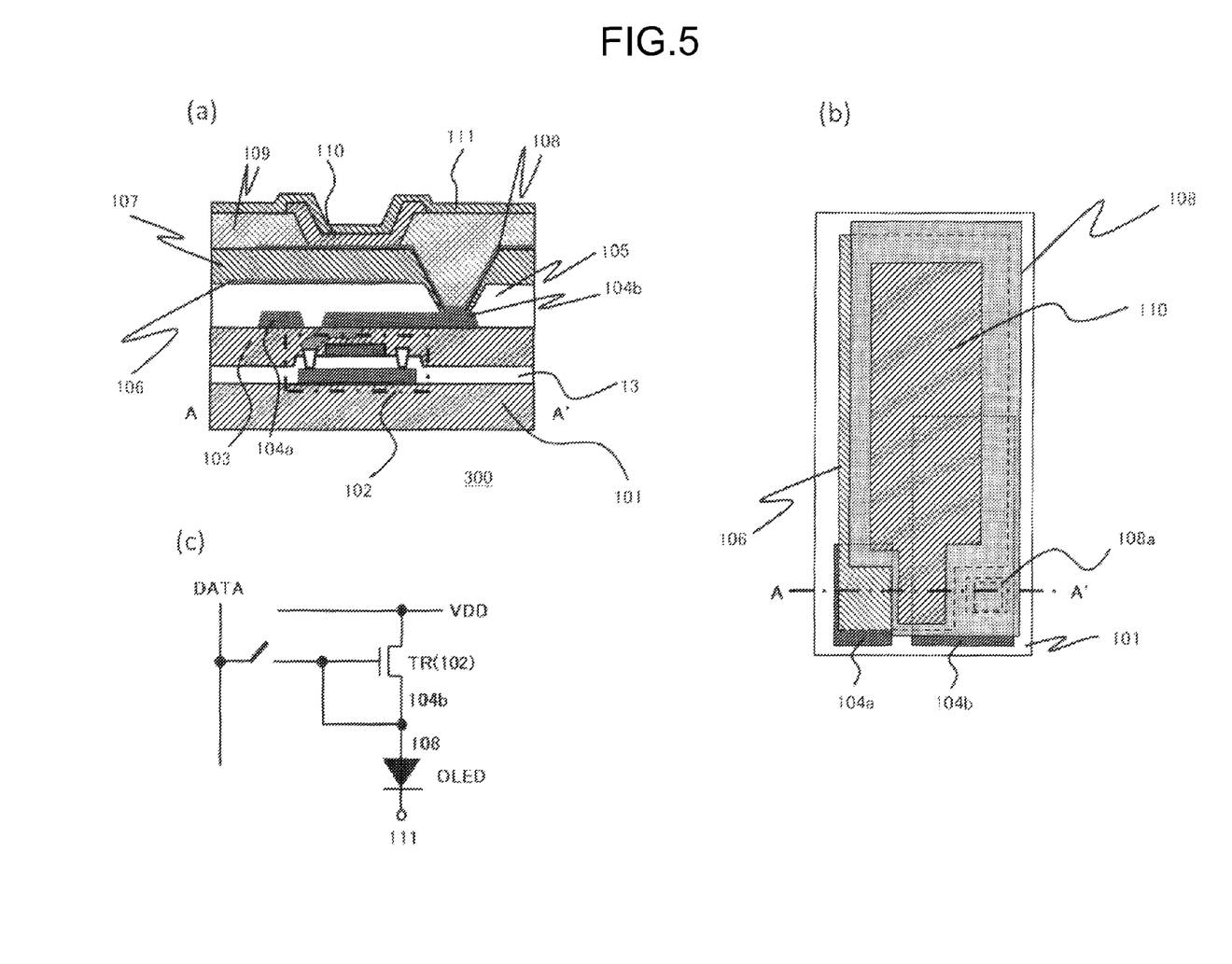
FIG. 5 is a diagram showing an approximate structure of a display device 400 related to another embodiment of the present invention.

Next, the structure of a display device 300 related to another embodiment of the present invention is explained while referring to FIG. 5 (a), FIG. 5 (b) and FIG. 5 (c). FIG. 5 (a) is a diagram showing an approximate structure of the display device 300 related to another embodiment of the present invention. FIG. 5 (b) is a planar view diagram of the display device 300, FIG. 5 (a) is a cross sectional view along the line A-A' in FIG. 5 (b) and FIG. 5 (c) is a circuit diagram in the display device 300.

Although the display device 300 in FIG. 5 (a) has almost the same structure as the display device 100 explained while referring to FIG. 2 (a), in the present embodiment the reflecting layer is 106 is made into a floating electrode without being connected to the wire 104a, and the pixel transparent electrode 108 is connected to the wire 104b via the contact hole 108a formed in the light path length expanded layer 107 and planarized film 105.

A current path for an organic EL element in the present embodiment becomes the pixel transparent electrode 108 from the thin film transistor 102 via the wire 104b as shown in FIG. 5 (c). That is, a current is supplied from the thin film transistor 102 to the pixel transparent electrode 108 via the wire 104b in response to a data signal and by supplying the current to the organic EL layer 110, the organic layer 110 emits light and an image is formed.

The material of the light path length expanded layer 107 in the display device 300 shown in FIG. 5 (a) is not limited to an insulator but may be a conductor unlike the display device 100 shown in FIG. 2 (a).

By making the reflecting layer in a floating state or an electrode with a different potential to a wire back layer, it is possible to cover parasitic capacitance coupling between pixel operation and ON/OFF of an organic EL element light emittance and stabilize operation of the display device 300. In addition, since positional restriction other than current extraction from the pixel transparent electrode 108 is not received, each structure of the display device 300 has an increased level of arrangement freedom and increased aperture formation becomes possible.

Embodiment Four

Figure 6:
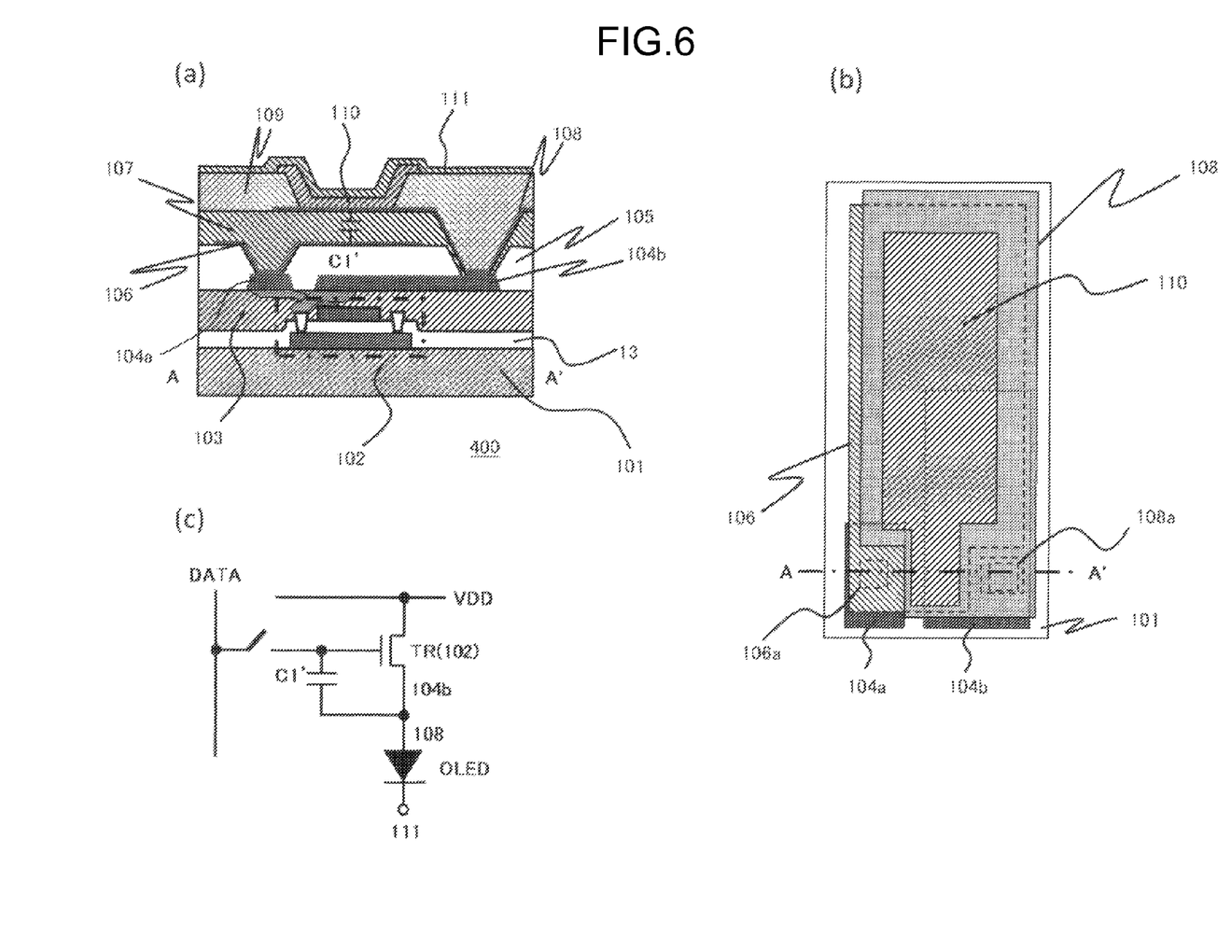
FIG. 6 is a diagram showing an approximate structure of a display device 500 related to another embodiment of the present invention.

Next, the structure of a display device 400 related to another embodiment of the present invention is explained while referring to FIG. 6 (a), FIG. 6 (b) and FIG. 6 (c). FIG. 6 (a) is a diagram showing an approximate structure of the display device 400 related to another embodiment of the present invention. FIG. 6 (a) is a planar view diagram of the display device 400, FIG. 6 (*b*) is a cross sectional view along the line A-A' in FIG. 6 (*a*) and FIG. 6 (*c*) is a circuit diagram in the display device 400.

Although the display device 400 in FIG. 6 (*a*) has almost the same structure as the display device 100 explained while referring to FIG. 2 (*a*), the pixel transparent electrode 108 is connected with the wire 104*b* via the contact hole 108*a* formed in the light path length expanded layer 107 and planarized film 105, capacitance C1' is formed between the reflecting layer 106 and pixel transparent electrode 108, and the reflecting layer 106 and pixel transparent electrode 108 are combined.

That is, the reflecting layer 106 continues to be connected with the wire 104*a*, made independent from the pixel transparent electrode 108, and by applying a voltage it is possible to form capacitance C1' between the reflecting layer 106 and the pixel transparent electrode 108. In this way, it is possible to form pixel capacitance which can store a charge necessary for stable image display without securing a separate area.

A current path for an organic EL element in the present embodiment becomes the pixel transparent electrode 108 from the thin film transistor 102 via the wire 104*b* as shown in FIG. 6 (*c*). That is, a current is supplied from the thin film transistor 102 to the pixel transparent electrode 108 via the wire 104*b* in response to a data signal and by supplying the current to the organic EL layer 110, the organic layer 110 emits light and an image is formed.

Embodiment Five

Figure 7:
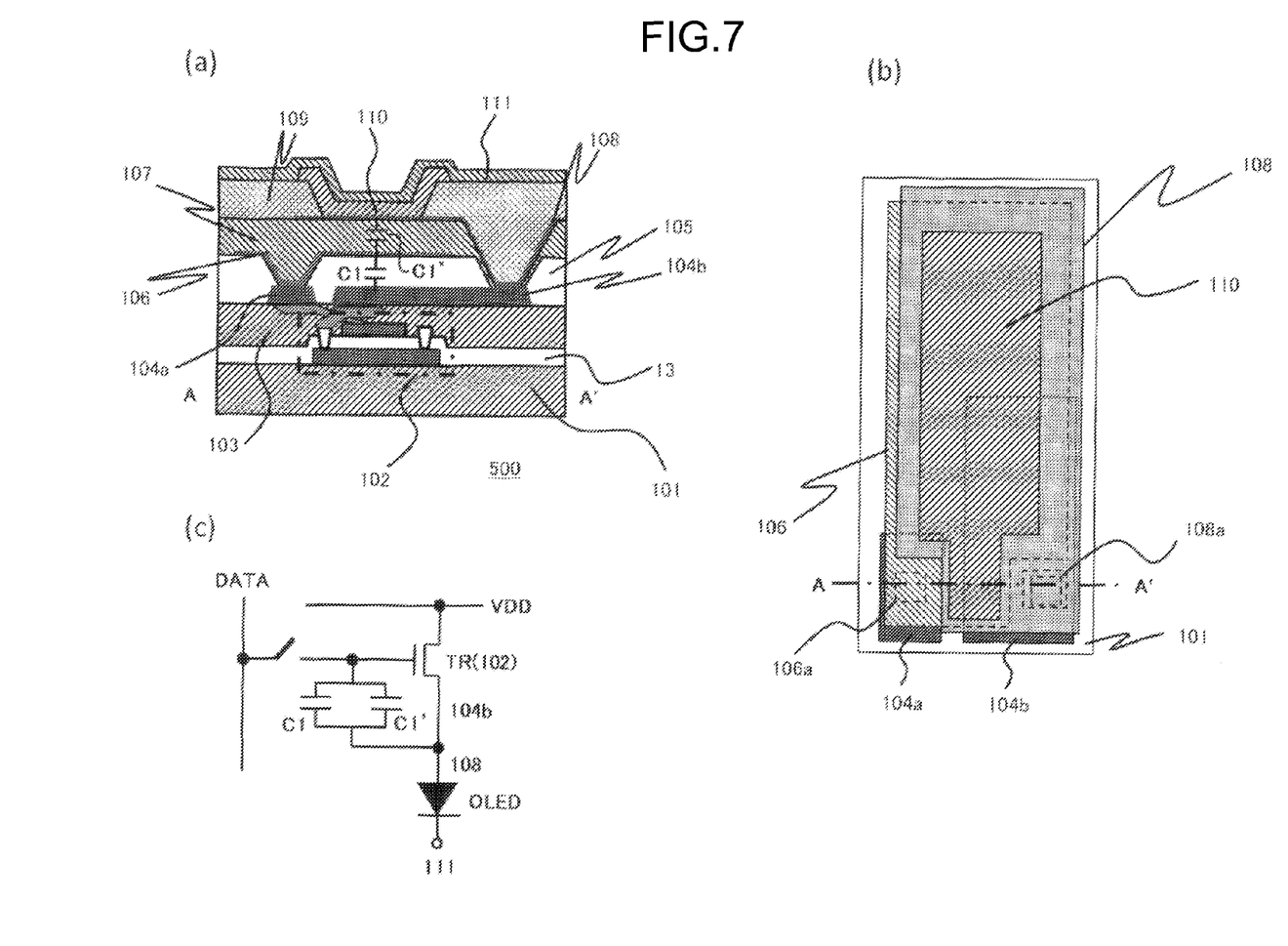
FIG. 7 is a diagram showing an approximate structure of a thin film transistor 101b of the display device 100 related to one embodiment of the present invention.

Next, the structure of a display device 500 related to another embodiment of the present invention is explained while referring to FIG. 7 (*a*), FIG. 7 (*b*) and FIG. 7 (*c*). FIG. 7 (*a*) is a diagram showing an approximate structure of the display device 500 related to another embodiment of the present invention. FIG. 7 (*a*) is a planar view diagram of the display device 500, FIG. 7 (*b*) is a cross sectional view along the line A-A' in FIG. 7 (*a*) and FIG. 7 (*c*) is a circuit diagram in the display device 500.

Although the display device 500 in FIG. 7 (*a*) has almost the same structure as the display device 400 explained while referring to FIG. 5 (*a*), a capacitance C1' is further formed between the reflecting layer 106 and the thin film transistor 102 which is a structure combining the second embodiment and fourth embodiment.

That is, the reflecting layer 106 continues to be connected with the wire 104*a*, made independent from the pixel transparent electrode 108, and by applying a voltage it is possible to form capacitance C1' between the reflecting layer 106 and the pixel transparent electrode 108. That is, the reflecting layer 106 and the pixel transparent electrode 107 are combined to form a capacitor electrode. Furthermore, a capacitance C1 is formed between the reflecting layer 106 and an electrode of the thin film transistor 102. In this way, it is possible to form pixel capacitance which can store a charge necessary for stable image display without securing a separate area. In addition, it is possible to secure a larger capacitance by combining the capacitance C1 and C1'.

A current path for an organic EL element in the present embodiment becomes the pixel transparent electrode 108 from the thin film transistor 102 via the wire 104*b* as shown in FIG. 7 (*c*). That is, a current is supplied from the thin film transistor 102 to the pixel transparent electrode 108 via the wire 104*b* in response to a data signal and by supplying the current to the organic EL layer 110, the organic layer 110 emits light and an image is formed.

As described above, in the present invention it is possible to reduce changes in a visual angle of colors by relieving micro cavity effects without adding any changes to an organic EL layer and cathode electrode in a conventional organic EL element and provide a display device in which a pixel capacitor can be formed which can store a charge necessary for stable image display without securing a separate area.

What is claimed is:

1. A display device comprising;
    a plurality of pixels having an organic EL layer and arraigned in a shape of a matrix above a substrate;
    a plurality of thin film transistors arranged corresponding to each of the plurality of pixels, wherein each of the plurality of thin film transistors comprises a source electrode, a drain electrode, and a gate electrode;
    a planarized film covering the plurality of thin film transistors and a first wire connected with at least one of the plurality of thin film transistors;
    a reflecting layer formed above the planarized film and connected with the first wire at a first portion;
    a transparent layer covering the reflecting layer; and
    a pixel transparent electrode formed above the transparent layer and connected with the reflecting layer at a second portion,
    wherein
    the second portion does not overlap with the first portion in a planar view,
    the reflecting layer is connected with the source electrode or the drain electrode, and is electrically isolated from the gate electrode,
    the pixel transparent electrode has a region physically contacting with the organic EL layer,
    the reflecting layer overlaps the entirety of the region in a planar view,
    the first portion and the second portion do not overlap with the region in a planar view, and
    a part of the region is between the first portion and the second portion.

2. The display device according to claim 1, wherein the transparent layer is formed from a resin or an inorganic insulation film, wherein the resin includes acryl resin and/or polyimide resin, and the inorganic insulation film includes SiO and/or SiN.

3. The display device according to claim 1, further comprising:
    an upper portion electrode, a distance between the upper portion electrode and the reflecting layer being 500 nm or more.

4. The display device according to claim 1, wherein the planarized film covers a second wire, and
    the reflecting layer and the second wire form a capacitance.

5. The display device according to claim 4, wherein one of the thin film transistors has a source electrode, a drain electrode, and a gate electrode,
    the first wire is connected with one of the source electrode and the drain electrode, and
    the second wire is connected with the gate electrode.

6. The display device according to claim 1, wherein the planarized film has a first contact hole, the first contact hole exposing the first wire,
    the transparent layer has a second contact hole, the second contact hole exposing the reflecting layer,
    the reflecting layer is on and in physical contact with the first wire at the first contact hole,
    the pixel transparent electrode is on and in physical contact with the reflecting layer at the second contact hole.

7. The display device according to claim 6, wherein the first contact hole does not overlap the second contact hole in a planar view.

8. A display device comprising;
a substrate;
a thin film transistor formed on the substrate, wherein the thin film transistor comprises a source electrode, a drain electrode, and a gate electrode;
a plurality of pixels arranged in a matrix above the substrate, each pixel including a lower electrode, an upper electrode, a light emitting layer disposed between the lower electrode and the upper electrode, and a reflecting electrode disposed between the lower electrode and the thin film transistor;
a first wire electrically connected with the thin film transistor;
a first insulation film formed above the thin film transistor and the first wire, the reflecting electrode located on the first insulation film;
a second insulation film formed between the reflecting electrode and the lower electrode;
a first contact hole formed at the first insulation film and exposing the first wire, the reflecting electrode being on and in physical contact with the first wire at the first contact hole; and
a second contact hole formed at the second insulation film, exposing the reflecting electrode, and not overlapping the first contact hole in a planar view, the lower electrode being on and in physical contact with the reflecting electrode at the second contact hole,
wherein the reflecting electrode is connected with the source electrode or the drain electrode, and is electrically isolated from the gate electrode,
the pixel transparent electrode has a region physically contacting with the organic EL layer,
the reflecting electrode overlaps the entirety of the region in a planar view,
the first contact hole and the second contact hole do not overlap with the region in a planar view, and
a part of the region is between the first contact hole and the second contact hole.

9. The display device according to claim 8, wherein the first insulation film is formed from an organic material.

10. The display device according to claim 8, wherein the second insulation film is formed from a resin or an inorganic insulation film, the resin including acryl resin or polyimide resin, the inorganic insulation film including SiO or SiN.

11. The display device according to claim 8, wherein a second wire is disposed between the first insulation film and the thin film transistor, and the reflecting electrode and the second wire form a capacitance.

12. The display device according to claim 11, wherein the thin film transistor has a source electrode, a drain electrode, and a gate electrode,
the first wire is connected with one of the source electrode and the drain electrode, and
the second wire is connected with the gate electrode.

13. A display device comprising:
a substrate;
a thin film transistor formed on the substrate, the thin film transistor comprising a source electrode, a drain electrode, and a gate electrode;
a plurality of pixels arranged in a matrix above the substrate, wherein each of the plurality of pixels comprises a lower electrode, an upper electrode, a light emitting layer disposed between the lower electrode and the upper electrode, and a reflecting electrode disposed between the lower electrode and the thin film transistor;
a first wire electrically connected with the thin film transistor;
a first insulation film formed above the thin film transistor and the first wire, the reflecting electrode located on the first insulation film;
a second insulation film formed between the reflecting electrode and the lower electrode;
a first contact hole formed at the first insulation film and exposing the first wire, the reflecting electrode being on and in physical contact with the first wire at the first contact hole;
a second contact hole formed at the second insulation film, exposing the reflecting electrode, and not overlapping the first contact hole in a planar view, the lower electrode being on and in physical contact with the reflecting electrode at the second contact hole; and
a bank layer located on the lower electrode,
wherein the reflecting electrode is connected with the source electrode or the drain electrode, and is electrically isolated from the gate electrode,
the lower electrode has a region exposed by the bank layer,
the reflecting electrode overlaps the entirety of the region in a planar view,
the first contact hole and the second contact hole do not overlap with the region in a planar view, and
a part of the region is between the first contact hole and the second contact hole.

* * * * *